United States Patent
Gleissner et al.

(10) Patent No.: US 9,968,970 B2
(45) Date of Patent: May 15, 2018

(54) SPIN CHUCK WITH IN SITU CLEANING CAPABILITY

(71) Applicant: LAM RESEARCH AG, Villach (AT)

(72) Inventors: Andreas Gleissner, Dobriach (AT); Peter Strutzmann, St. Veit/Glan (AT)

(73) Assignee: LAM RESEARCH AG, Villach (AT)

(*) Notice: Subject to any disclaimer, the term of this patent is extended or adjusted under 35 U.S.C. 154(b) by 73 days.

(21) Appl. No.: 14/960,210

(22) Filed: Dec. 4, 2015

(65) Prior Publication Data

US 2017/0162427 A1  Jun. 8, 2017

(51) Int. Cl.
| | |
|---|---|
| *H01L 21/687* | (2006.01) |
| *B08B 3/04* | (2006.01) |
| *B08B 9/00* | (2006.01) |
| *F26B 21/00* | (2006.01) |
| *H01L 21/67* | (2006.01) |

(52) U.S. Cl.
CPC ............ *B08B 3/04* (2013.01); *B08B 9/00* (2013.01); *F26B 21/00* (2013.01); *H01L 21/6708* (2013.01); *H01L 21/67028* (2013.01); *H01L 21/67051* (2013.01); *H01L 21/67115* (2013.01); *H01L 21/68792* (2013.01)

(58) Field of Classification Search
CPC .................... H01L 21/02041; H01L 21/67051
See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 6,485,531 B1 | 11/2002 | Schob | |
| 8,646,767 B2 | 2/2014 | Kumnig et al. | |
| 2003/0116087 A1* | 6/2003 | Nguyen | C23C 16/34 118/715 |
| 2004/0016637 A1* | 1/2004 | Yang | A23D 7/00 204/242 |
| 2006/0021636 A1* | 2/2006 | Miya | B08B 3/04 134/33 |
| 2007/0245954 A1* | 10/2007 | Collins | H01L 21/67017 118/326 |
| 2007/0283983 A1* | 12/2007 | Park | B08B 3/02 134/21 |
| 2008/0229811 A1* | 9/2008 | Zhao | B25B 11/005 73/104 |
| 2010/0101497 A1* | 4/2010 | Izuta | H01L 21/67051 118/730 |

(Continued)

FOREIGN PATENT DOCUMENTS

WO    2007/101764 A1    9/2007

*Primary Examiner* — Marc Lorenzi

(57) ABSTRACT

In a method and apparatus for processing wafer-shaped articles, a spin chuck is positioned inside a process chamber. The spin chuck is configured to hold a wafer-shaped article at a predetermined process position. A cover covers the spin chuck and is affixed to or integral with the spin chuck for rotation therewith. The cover has a central opening. A stationary nozzle assembly extends into the process chamber such that a discharge end of the stationary nozzle assembly passes through the central opening of the cover. The nozzle assembly comprises a rinse nozzle configured to direct rinse liquid radially outwardly of the nozzle assembly onto a downwardly-facing surface of the cover.

6 Claims, 2 Drawing Sheets

(56) References Cited

U.S. PATENT DOCUMENTS

| | | | |
|---|---|---|---|
| 2013/0048607 A1* | 2/2013 | Matsushita | H01L 21/67028 216/83 |
| 2013/0104940 A1* | 5/2013 | Nagamine | H01L 21/6715 134/30 |
| 2014/0060423 A1* | 3/2014 | Nakai | B05C 11/1039 118/50 |
| 2015/0008632 A1 | 1/2015 | Gleissner et al. | |
| 2017/0040188 A1* | 2/2017 | Kikumoto | H01L 21/6708 |

* cited by examiner

SPIN CHUCK WITH IN SITU CLEANING CAPABILITY

BACKGROUND OF THE INVENTION

1. Field of the Invention

The invention relates generally to an apparatus and method for processing wafer-shaped articles, such as semiconductor wafers, and more particularly relates to such an apparatus and method comprising a spin chuck that includes an in situ cleaning capability.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531.

Various processes are conducted at elevated temperatures on such spin chucks, in closed chambers. For example, in a gas phase process to remove photoresist from a wafer, temperatures of about 400° C. are applied. Under such conditions, by-products of the photoresist removal process deposit on interior surfaces of the chamber, such as the chuck and the chamber walls. These by-products are mainly polymers, which can be dissolved and rinsed away with deionized water; however, without such rinsing, the chamber will become progressively more contaminated, which could lead to unacceptable particulate impurities on the wafer surfaces.

SUMMARY OF THE INVENTION

The present inventors have developed an improved apparatus and method for treatment of wafer-shaped articles, in which a spin chuck is designed with an in situ cleaning capability.

Thus, in one aspect, the present invention relates to an apparatus for processing wafer-shaped articles, comprising a process chamber and a spin chuck positioned inside the process chamber. The spin chuck is configured to hold a wafer-shaped article at a predetermined process position. A cover covers the spin chuck and is affixed to or integral with the spin chuck for rotation therewith. The cover has a central opening. A stationary nozzle assembly extends into the process chamber such that a discharge end of the stationary nozzle assembly passes through the central opening of the cover. The nozzle assembly comprises a rinse nozzle configured to direct rinse liquid radially outwardly of the nozzle assembly onto a downwardly-facing surface of the cover.

In preferred embodiments of the apparatus according to the present invention, the rinse nozzle can be a single nozzle radially directed to the downwardly facing surface of the cover. Alternatively the rinse nozzle can be annular or there can be a plurality of annularly arranged radially directed nozzles. Such an annular rinse nozzle can be formed by providing a shoulder configured to deflect rinse liquid radially outwardly. The cover can be a flat disc or advantageously has the shape of a dome.

In preferred embodiments of the apparatus according to the present invention, the nozzle assembly further comprises at least one process liquid nozzle configured to direct process liquid downwardly toward the spin chuck without first contacting the cover.

In preferred embodiments of the apparatus according to the present invention, the nozzle assembly further comprises a central nozzle for supplying process gas or liquid to the spin chuck.

In preferred embodiments of the apparatus according to the present invention, the annular rinse nozzle surrounds the central nozzle.

In preferred embodiments of the apparatus according to the present invention, the shoulder of the annular rinse nozzle is formed integrally with an exterior surface of the central nozzle.

In preferred embodiments of the apparatus according to the present invention, the cover and an upper part of the process chamber define a gas distribution chamber, and the cover comprises plural openings formed in each of a central and a peripheral region thereof, thereby to supply process gas from the gas distribution chamber to a surface of a wafer-shaped article when held by the spin chuck.

In preferred embodiments of the apparatus according to the present invention, each of the plural openings has a cross-sectional area in a range from 0.3 to 2.0 mm$^2$, preferably from 0.5 to 1.5 mm$^2$, and more preferably from 0.7 to 1.2 mm$^2$.

In preferred embodiments of the apparatus according to the present invention, the plural openings include at least 20 of the openings, more preferably at least 50 of the openings, and still more preferably at least 80 of the openings.

In preferred embodiments of the apparatus according to the present invention, at least one gas supply nozzle is positioned radially outside of the nozzle assembly, the at least one gas supply nozzle supplying process gas to the gas distribution chamber.

In preferred embodiments of the apparatus according to the present invention, the cover is continuously curved over its entire downwardly-facing surface.

In preferred embodiments of the apparatus according to the present invention, a discharge outlet of the rinse nozzle and a lower side surface of the nozzle assembly meet at a sharp edge positioned adjacent a lower end of the central opening of the cover.

In preferred embodiments of the apparatus according to the present invention, the spin chuck comprises a magnetic rotor, the apparatus further comprising a magnetic stator mounted outside of the process chamber and surrounding the magnetic rotor.

In another aspect, the present invention relates to a method for processing wafer-shaped articles, comprising:

dispensing a process liquid onto a rotating wafer-shaped article mounted on a spin chuck positioned in a process chamber;

wherein the process liquid is dispensed through a stationary nozzle assembly that extends into the process chamber such that a discharge end of the stationary nozzle assembly passes through a central opening of a cover that covers the spin chuck and is affixed to the spin chuck to rotate therewith; and rinsing a downwardly-facing surface of the cover by supplying rinse liquid to a rinse nozzle incorporated in the nozzle assembly, the rinse nozzle being configured to direct rinse liquid radially outwardly of the nozzle assembly onto the downwardly-facing surface of the cover.

In preferred embodiments of the method according to the present invention, after the dispensing of process liquid, an upwardly-facing surface of the wafer-shaped article is rinsed by supplying rinse liquid to a central nozzle incorporated in the nozzle assembly.

In preferred embodiments of the method according to the present invention, the rinsing of the downwardly-facing surface of the cover and the rinsing of the upwardly-facing surface of the wafer-shaped article are performed simultaneously.

In preferred embodiments of the method according to the present invention, after the rinsing of the downwardly-facing surface of the cover, the spin chuck is rotated so as to dry the downwardly-facing surface of the cover.

In preferred embodiments of the method according to the present invention, after the rinsing of the downwardly-facing surface of the cover and the rinsing of the upwardly-facing surface of the wafer-shaped article, the spin chuck is rotated so as simultaneously to dry the downwardly-facing surface of the cover and the upwardly-facing surface of the wafer-shaped article.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
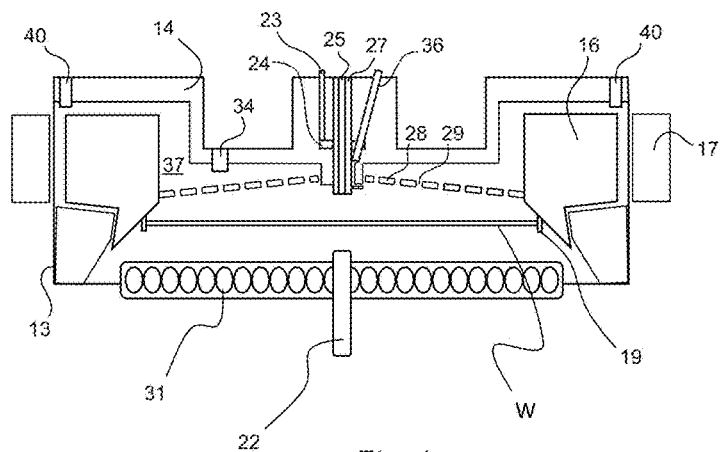
FIG. 1 is an explanatory cross-sectional side view of an apparatus according to a first embodiment of the invention.

Referring now to FIG. 1, an apparatus for treating surfaces of wafer-shaped articles according to a first embodiment of the invention comprises a closed process chamber 13, in which is arranged an annular spin chuck 16. Spin chuck 16 is a magnetic rotor that is surrounded by a magnetic stator 17 positioned outside the chamber, so that the magnetic rotor is freely rotating and levitating within the chamber 13 without touching the chamber walls. The chamber 13 is closed at its upper end by lid 14 rigidly secured thereto.

Further structural details of such a magnetic rotor chuck are described, for example, in commonly-owned U.S. Pat. No. 8,646,767.

The annular spin chuck 16 has a circular series of downwardly-depending gripping pins 19, which releasably hold a wafer W during processing. A lower dispense unit 22 is provided so as to supply liquid and/or gas to the side of the wafer W that faces downwardly within chamber 13. A heater 31 is disposed within the chamber 13, so as to heat the wafer W to a desired temperature depending upon the process being performed. Heater 31 preferably comprises a multitude of blue LED lamps, whose radiation output tends to be absorbed preferentially by silicon wafers relative to the components of the chamber 13.

An upper dispense unit comprises an outer gas conduit 27 and an inner liquid conduit 25 arranged coaxially within the outer gas conduit 27. Conduits 25, 27 both traverse the lid 14, and permit liquid and gas to be supplied to the side of the wafer W that faces upwardly within chamber 13. The upper dispense unit also includes a conduit 23 that supplies gas to an annular nozzle 24 in which is formed at least one side nozzle, as will be explained in greater detail below.

The upper dispense unit also includes a conduit 36 that supplies rinse liquid for in situ cleaning, as will also be explained in detail below.

Figure 2:
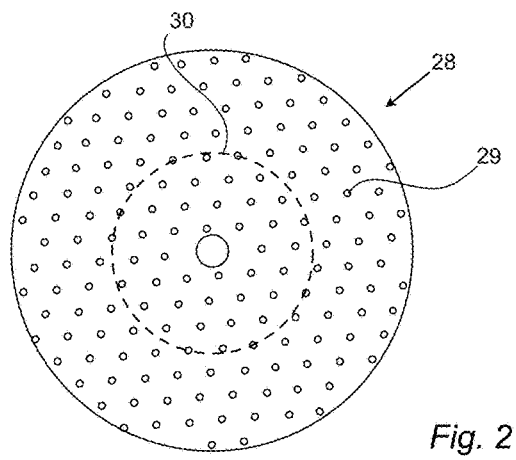
FIG. 2 is a plan view of the outlet cover of the gas showerhead used in the embodiment of FIG. 1.

A gas showerhead is delimited at its lower side by an outlet cover 28, which is also shown in plan view in FIG. 2. The outlet cover 28 in this embodiment has a dome shape and comprises a multitude of discharge orifices 29, which permit process gas to pass out of the gas showerhead from the gas distribution chamber 37 to the region adjacent the upwardly facing side of the wafer W. The discharge orifices 29 in this embodiment each have a cross-sectional area in a range from 0.3 to 2.0 mm, preferably from 0.5 to 1.5 mm, and more preferably from 0.7 to 1.2 mm. There are preferably at least 20 orifices 29, more preferably at least 50, still more preferably at least 80, and even more preferably 300.

The outlet dome 28 is rigidly secured to or formed integrally with the spin chuck 16, and therefore rotates along with the spin chuck 16. On the other hand, the conduits 25, 27 are stationarily mounted in the lid 14 of chamber 13, and pass with a slight clearance through a central opening formed in the dome 28.

As shown in FIG. 2, there are a plurality of these orifices 29 in each of a central region and a peripheral region of the dome 28, wherein the central region is defined as being the area within the half-radius 30 of the dome 28, and the peripheral region is defined as being the area outside of the half-radius 30.

Returning to FIG. 1, it will be seen that the gas distribution chamber 37 is supplied with process gas through a process gas supply conduit 34, which in turn communicates with a source of process gas (not shown), which in preferred embodiments is a gas containing ozone.

Additional gas conduits 40 are provided near the outer periphery of chamber 13, and direct a purge gas such as $N_2$ into the gap defined between the outer periphery of spin chuck 16 and the surrounding cylindrical wall of chamber 13. Gas from nozzles 40 also forms a boundary such that process gas supplied from nozzle 34 is confined within distribution chamber 37.

Figure 3:
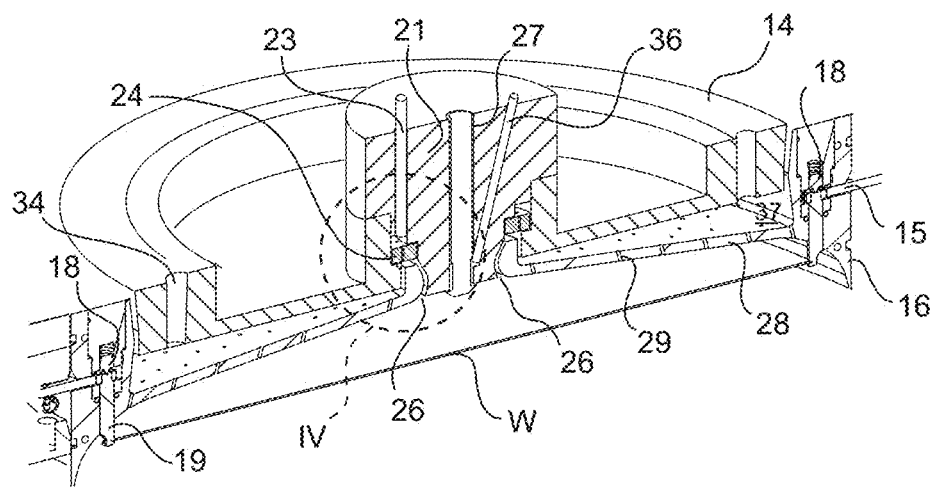
FIG. 3 is a perspective view, partly in section, showing additional details of the embodiment of FIG. 1.

As shown in FIG. 3, the dome 28 in this embodiment is formed integrally with the spin chuck 16. The lower end of nozzle assembly 21 passes through a central opening in dome 28, and an annular gap 26 is defined between these two components.

The spin chuck 16 also includes the gripping pins 19 described above, as well as needle bearings 18 that urge the pins 19 downwardly so that gear wheels at the upper ends of the pins 19 remain in continuous meshing engagement with the toothed sectors of a common ring gear 15, as described for example in commonly-owned U.S. Pat. No. 8,646,767 and U.S. published patent application no. 2015/0008632.

The clearance or annular gap 26 is necessary to permit the spin chuck 16 with integral dome 28 to rotate relative to the stationary nozzle head 21 that is mounted in the lid 14 of the apparatus.

Figure 4:
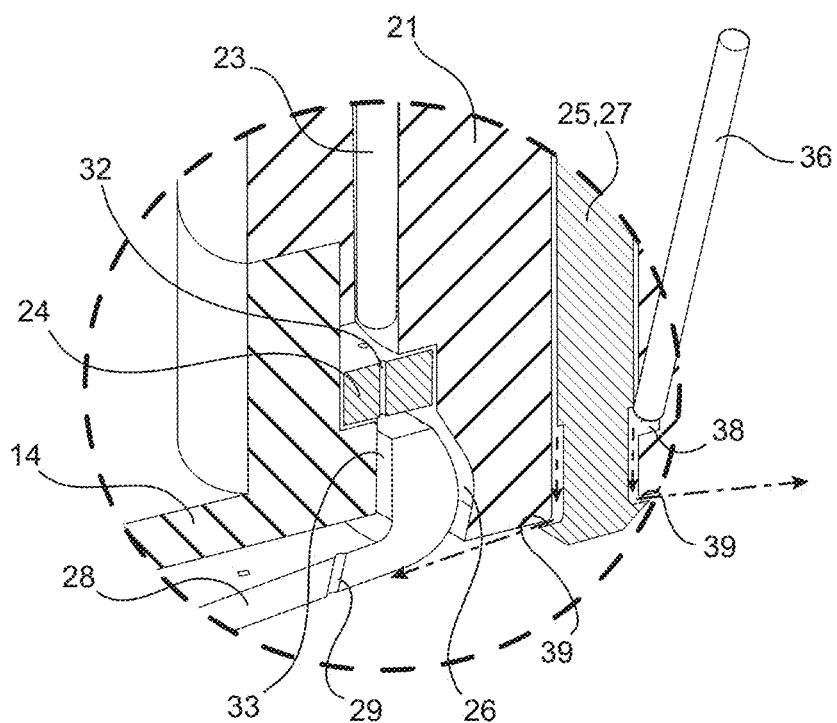
FIG. 4 is an enlarged view of the detail IV in FIG. 3.

Nozzle assembly 21 also includes a nozzle block 24, supplied with gas from conduit 23, in which is formed at least one side nozzle 32 which directs gas adjacent this annular gap 26, as shown in FIG. 4. The side nozzle 32 is preferably supplied with an inert gas such as $N_2$, to control or prevent undesired flow of process gas through gaps 33 and 26.

It will be noted that the bore of nozzles 32 is significantly narrower than the area of the flow paths at the inlet and outlet of nozzles 32. Nozzles 32 are moreover positioned adjacent to yet radially outside of the gap 26. Thus, as inert gas passes through and is discharged from the nozzles 32, the inert gas is accelerated within the nozzles 32, which in turn generates a reduced pressure at the upper end of the annular gap 26, via the Venturi effect. This reduced pressure impedes or prevents any undesired flow of process gas into the gap 26, as might otherwise occur.

Conduit 36 is supplied with a rinse liquid such as deionized water from a rinse liquid supply (not shown). Conduit 36 discharges rinse liquid into an annular recess 38 formed in nozzle assembly 21, surrounding the coaxial nozzles 25, 27. The rinse liquid then flows downwardly along the exterior vertical surface of the nozzle 27, as shown by the downwardly-directed broken line arrows in FIG. 4.

The nozzle pair 25, 27 in this embodiment is formed with a radially outwardly projecting shoulder, which provides a substantially horizontal annular surface 39 on which the rinse liquid impinges as it exits the housing 21 of the nozzle assembly. As the rinse liquid impinges on the annular shoulder surface 39, it is re-directed radially outwardly, as shown by the broken line arrows in FIG. 4.

In particular, the position of the deflecting shoulder surface 39 and its angle of inclination are selected such that the rinse liquid will be sprayed onto the downwardly facing surface of the dome 28, so as to dissolve and rinse away the polymer-based residues that have accumulated on the downwardly facing surface of dome 28 during wafer processing within the chamber 13.

It will be appreciated that the recess 38 and outlet surface 39 need not be annular; they may instead each be formed over only a limited part of the circumference of the nozzle pair 25, 27, because, as the chuck 16 with integrated dome 28 rotates, the rinse liquid will in that case still be applied to the entire downwardly facing surface of the dome 28.

The coaxial surrounding nozzle 27 in this embodiment is also connected to a supply (not shown) of rinse liquid such as deionized water, whereas the central nozzle 25 is supplied with a gas, which may be a process gas or an inert gas for drying of the wafer.

The conduit 36 and nozzle 27 are preferably supplied with rinse liquid independently of one another, so that rinse liquid may be supplied at will through either or both of these elements.

As can be seen in FIG. 4, the deflecting surface 39 preferably meets the adjacent angled surface of the nozzle pair 25, 27 at a sharp angle, which helps prevent rinse liquid from migrating into the gap 26. Moreover, the surfaces of the nozzle assembly that face downwardly into the chamber 13, as well as the downwardly facing surface of the dome 28, are preferably made of a hydrophilic material, or provided with a hydrophilic coating or surface treatment, to aid in the rinsing and drying of those surfaces.

An advantage of the rinsing capability described above is that the downwardly facing surface of the dome 28, which is otherwise difficult to access, can be cleaned without taking the apparatus out of service. Indeed, rinsing of the downwardly facing surface of the dome 28 via conduit 36, recess 38 and deflecting shoulder 39, may be performed even while a wafer W is positioned on the spin chuck 16, and, if desired, simultaneously with rinsing the wafer using the nozzle 27. After the wafer W and/or the downwardly facing surface of the dome 28 have been rinsed in this manner, the rotation of the spin chuck is then increased so as to effect drying of the rinsed surfaces, during which time rinse liquid is not supplied to at least the conduit 36 (in case of drying the dome surface only), and during which time a gas is optionally supplied through the conduit 25.

While the present invention has been described in connection with various preferred embodiments thereof, it is to be understood that those embodiments are provided merely to illustrate the invention, and that the invention is not limited to those embodiments, but rather includes that which is encompassed by the true scope and spirit of the appended claims.

What is claimed is:

1. An apparatus for processing a wafer-shaped article, the apparatus comprising:
   a process chamber;
   a spin chuck positioned inside the process chamber, wherein the spin chuck is configured to hold the wafer-shaped article at a predetermined process position;
   a cover covering the spin chuck and affixed to the spin chuck, wherein the cover rotates with the spin chuck and has a central opening;
   a stationary nozzle assembly that extends into the process chamber, such that a discharge end of the stationary nozzle assembly passes through the central opening of the cover, wherein the stationary nozzle assembly comprises a rinse nozzle, and wherein the rinse nozzle is configured to direct a rinse liquid radially outwardly of the stationary nozzle assembly onto a downwardly-facing surface of the cover; and
   an annular lid disposed around the stationary nozzle assembly and configured to close off the process chamber, wherein the annular lid is stationary with the stationary nozzle assembly,
   wherein
      the cover extends radially outward from an area between a portion of the annular lid and a portion of the stationary nozzle assembly to the spin chuck,
      an annular center portion of the cover splits gas received from an annular nozzle of the stationary nozzle assembly, where a first portion of the gas is provided to a second area between the annular lid and the cover and a second portion of the gas is provided to a third area, and
      the third area is on an opposite side of the cover as the second area.

2. The apparatus of claim 1, wherein the annular nozzle directs the gas over an inner circumferential edge of the cover to the second area and the third area.

3. The apparatus of claim 1, wherein the annular center portion is disposed in the area between the portion of the annular lid and the portion of the stationary nozzle assembly.

4. The apparatus of claim 1, wherein the annular center portion extends axially and away from a radially extending portion of the cover.

5. The apparatus of claim 1, wherein the annular nozzle is disposed radially outward of the rinse nozzle.

6. The apparatus of claim 5, wherein:
   the stationary nozzle assembly comprises a stationary nozzle head; and
   the stationary nozzle head is disposed between (i) the rinse nozzle and (ii) the area between the portion of the annular lid and the portion of the stationary nozzle assembly.

* * * * *